(12) United States Patent
Seguine

(10) Patent No.: US 9,513,322 B1
(45) Date of Patent: *Dec. 6, 2016

(54) INPUT/OUTPUT MULTIPLEXER BUS

(71) Applicant: Cypress Semiconductor Corporation, San Jose, CA (US)

(72) Inventor: Dennis R. Seguine, Temecula, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 118 days.

This patent is subject to a terminal disclaimer.

(21) Appl. No.: 14/222,227

(22) Filed: Mar. 21, 2014

Related U.S. Application Data

(63) Continuation of application No. 13/306,840, filed on Nov. 29, 2011, now Pat. No. 8,717,042, which is a continuation of application No. 11/709,866, filed on Feb. 21, 2007, now Pat. No. 8,067,948.

(60) Provisional application No. 60/786,124, filed on Mar. 27, 2006.

(51) Int. Cl.
| | |
|---|---|
| *G01R 27/26* | (2006.01) |
| *G06F 13/14* | (2006.01) |
| *G01D 5/24* | (2006.01) |
| *G01R 31/28* | (2006.01) |
| *G01D 5/241* | (2006.01) |
| *G01R 31/02* | (2006.01) |

(52) U.S. Cl.
CPC ............ *G01R 27/2605* (2013.01); *G01D 5/24* (2013.01); *G01D 5/241* (2013.01); *G01D 5/2412* (2013.01); *G01D 5/2417* (2013.01); *G01R 27/26* (2013.01); *G01R 31/028* (2013.01); *G01R 31/2829* (2013.01)

(58) Field of Classification Search
CPC ...... G01D 5/24; G01D 5/241; G01D 5/2412; G01D 5/2417; G01R 27/26; G01R 27/2605; G01R 31/2829; G01R 31/028
USPC ....... 324/76.11, 76.59, 158.1, 519, 600, 649, 324/658, 673, 678, 686, 761, 765, 762.01; 710/100, 305, 306, 313
See application file for complete search history.

(56) References Cited

U.S. PATENT DOCUMENTS

| | | |
|---|---|---|
| 5,159,335 A | 10/1992 | Veneruso |
| 5,894,226 A | 4/1999 | Koyama |
| 6,480,921 B1 | 11/2002 | Mansoorian et al. |
| 6,643,810 B2 | 11/2003 | Whetsel |
| 6,847,203 B1 | 1/2005 | Conti et al. |
| 6,888,453 B2 | 5/2005 | Lutz et al. |
| 6,981,090 B1 | 12/2005 | Kutz et al. |
| 7,282,905 B2 | 10/2007 | Chen et al. |
| 7,307,485 B1 | 12/2007 | Snyder et al. |

(Continued)

OTHER PUBLICATIONS

USPTO Non Final Rejection for U.S. Appl. No. 11/709,866 dated Nov. 7, 2008; 14 pages.

(Continued)

*Primary Examiner* — Hoai-An D Nguyen

(57) ABSTRACT

One embodiment includes an I/O bus including a signal line coupled to a signal source and multiple line switches, each line switch to couple a corresponding I/O port to the signal line. Switch logic coupled to the I/O bus may programmatically switch the multiple line switches to couple at least one of the signal source and measurement circuitry to the respective I/O port.

20 Claims, 7 Drawing Sheets

(56) References Cited

U.S. PATENT DOCUMENTS

| | | |
|---|---|---|
| 7,312,616 B2 | 12/2007 | Snyder |
| 7,342,405 B2 | 3/2008 | Eldridge et al. |
| 8,941,394 B2 * | 1/2015 | Martin .................. G06F 3/0418 324/658 |
| 2006/0158268 A1 | 7/2006 | Mccorquodale et al. |
| 2011/0026519 A1 | 2/2011 | Sullam et al. |

OTHER PUBLICATIONS

USPTO Non Final Rejection for U.S. Appl. No. 13/306,840 dated Aug. 22, 2013; 8 pages.
USPTO Notice of Allowance for U.S. Appl. No. 11/709,866 dated Apr. 7, 2009; 8 pages.
USPTO Notice of Allowance for U.S. Appl. No. 13/306,840 dated Dec. 11, 2013; 9 pages.

* cited by examiner

INPUT/OUTPUT MULTIPLEXER BUS

RELATED APPLICATIONS

This application is a continuation of U.S. application Ser. No. 13/306,840, filed Nov. 29, 2011, now U.S. Pat. No. 8,717,042, issued May 5, 2014, which is a continuation of U.S. application Ser. No. 11/709,866, filed Feb. 21, 2007, now U.S. Pat. No. 8,067,948, issued Nov. 29, 2011, which claims priority to U.S. Provisional Patent Application No. 60/786,124, filed Mar. 27, 2006, all of which are incorporated by reference herein in their entirety.

TECHNICAL FIELD

This disclosure relates generally to bus architecture, and in particular but not exclusively, relates to an input/output bus capable of multiplexing input/output ports for various capacitance sense techniques.

BACKGROUND INFORMATION

Capacitance sensors are used to implement a variety of useful functions including touch sensors (e.g., touch pad, touch dial, touch wheel, etc.), determining the presence of an object, accelerometers, and other functions. FIG. 1A illustrates a conventional capacitance sensor 100 including a relaxation oscillator, a reference clock, and a frequency comparator. The relaxation oscillator is coupled to drive a charging current ($I_C$) in a single direction onto a device under test ("DUT") capacitor. As the charging current accumulates charge on the DUT capacitor, the voltage across the capacitor increases with time as a function of $I_C$ and its capacitance C. Equation 1 describes the relation between current, capacitance, voltage and time for a charging capacitor.

$$CdV = I_c dt \quad \text{(Equation 1)}$$

The relaxation oscillator begins by charging the DUT capacitor from a ground potential or zero voltage and continues to accumulate charge on the DUT capacitor at a fixed charging current Ic until the voltage across the DUT capacitor reaches a reference voltage (Vref). At Vref, the relaxation oscillator allows the accumulated charge to discharge or the DUT capacitor to "relax" back to the ground potential and then the process repeats itself. The relaxation oscillator outputs a relaxation oscillator clock signal (RO CLK) having a frequency ($f_{RO}$) dependent upon capacitance C of the DUT capacitor, charging current $I_C$, a discharge time $t_d$, and Vref, as described in equation 2 below.

$$f_{RO} = \left( C \cdot \frac{Vref}{I_C} + t_d \right)^{-1} \quad \text{(Equation 2)}$$

If capacitance C of the DUT capacitor changes, then $f_{RO}$ will change proportionally according to equation 2. By comparing $f_{RO}$ of RO CLK against the frequency ($f_{REF}$) of a known reference clock signal (REF CLK), the change in capacitance ΔC can be measured. Accordingly, equations 3 and 4 below describe that a change in frequency between RO CLK and REF CLK is proportional to a change in capacitance of the DUT capacitor.

$$\Delta C \propto \Delta f, \text{ where} \quad \text{(Equation 3)}$$

$$\Delta f = f_{RO} - f_{REF} \quad \text{(Equation 4)}$$

The frequency comparator is coupled to receive RO CLK and REF CLK, compare their frequencies $f_{RO}$ and $f_{REF}$, respectively, and output a signal indicative of the difference Δf between these frequencies. By monitoring Δf one can determine whether the capacitance of the DUT capacitor has changed.

FIG. 1B illustrates another capacitance sensing technique using a charge transfer mechanism. FIG. 1B illustrates a conventional capacitance sensor 101 including three switches 105 with control terminals $\phi_0$, $\phi_1$, and $\phi_2$, and summing capacitor 110 having a capacitance $C_{SUM}$, and an analog to digital ("ADC") converter 115. Capacitance sensor 101 may be used to sense changes in a DUT capacitor 120 having a changing capacitance $C_{DUT}$.

During operation, capacitance sensor 101 operates as follows to sense capacitance changes on DUT capacitor 120. First, summing capacitor 110 is discharged to a ground potential by asserting control terminal $\phi_0$ to open circuit switch SW0 and by asserting control terminal $\phi_1$ to close circuit switch SW1. Once discharged to ground, integrating capacitor 110 is disconnected from ground by asserting $\phi_1$ to open switch SW1. Then, DUT capacitor 120 is charged to the supply voltage VS by asserting $\phi_0$ to open circuit switch SW0 and asserting $\phi_2$ to close circuit switch SW2. Once DUT capacitor 120 charges to the supply voltage VS, the charge on DUT capacitor 120 is transferred onto summing capacitor 110 and distributed between the two capacitors. Charge transfer occurs by asserting $\phi_1$ and $\phi_2$ to open circuit switches SW1 and SW2, respectively, and asserting $\phi_0$ to close circuit switch SW0.

The above stages of charging DUT capacitor 120 and transferring the charge onto summing capacitor 110 are repeated a fixed number times causing the voltages of nodes N1 and N2 to ramp with time as illustrated in line graphs 130 and 135, respectively. After a fixed number of consecutive charging stages and charge transferring stages, ADC converter 115 samples the final voltage on node N2. The capacitance $C_{DUT}$ is determined based on the output of ADC converter 115 and is proportional to the voltage at node N2 after the final charge transfer stage.

Conventional integrated circuits incorporating a capacitance sense function typically include only one of the above types of capacitance sensors. These conventional capacitance sensors are hardwired directly to a single input/output port and cannot be flexibly coupled to a selectable port by the user.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method of operation for an input/output multiplexer bus are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
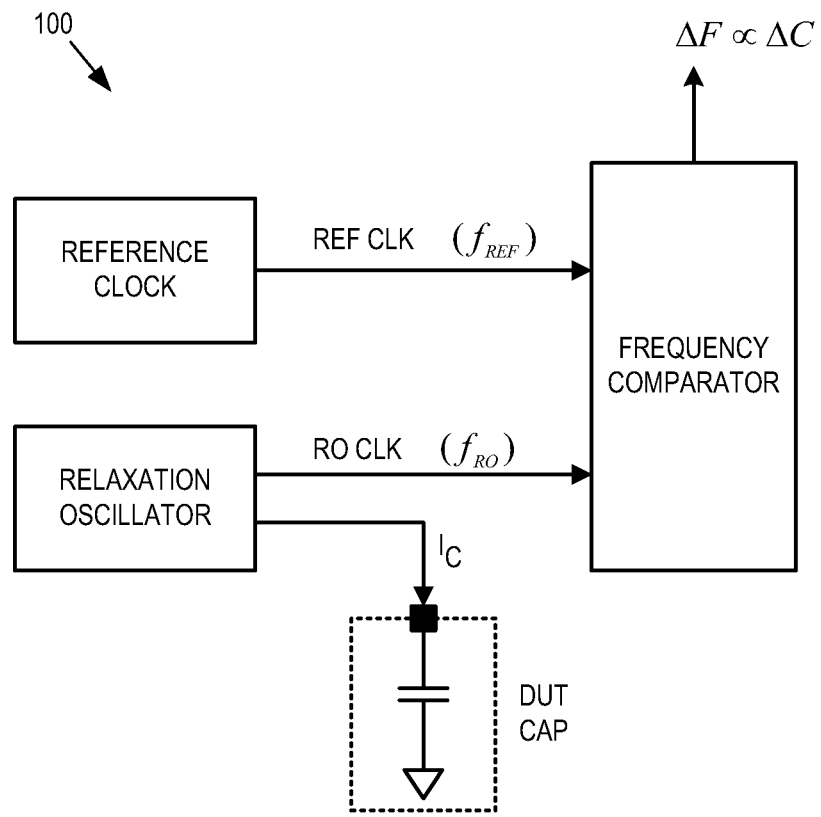
FIG. 1A is a block diagram illustrating a conventional capacitance sensor.
Figure 1B:
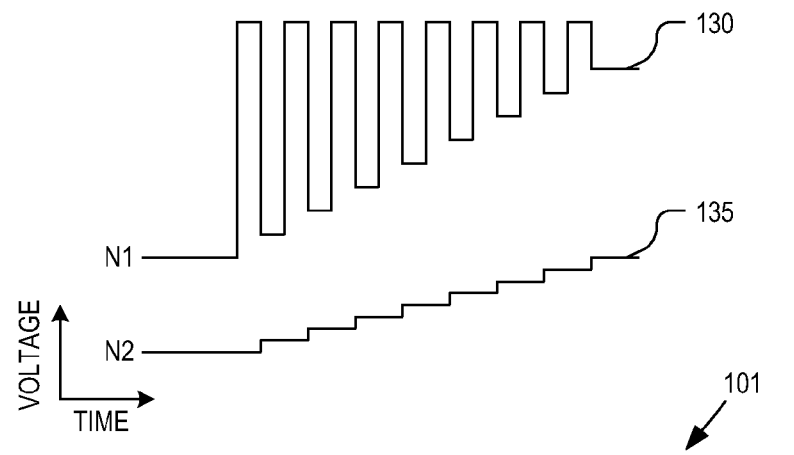
FIG. 1B is a block diagram illustrating a conventional capacitance sensor.
Figure 1B:
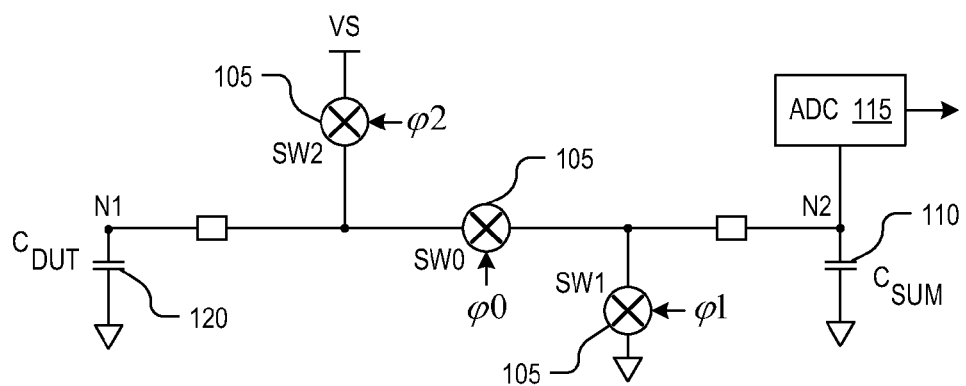
Figure 2:
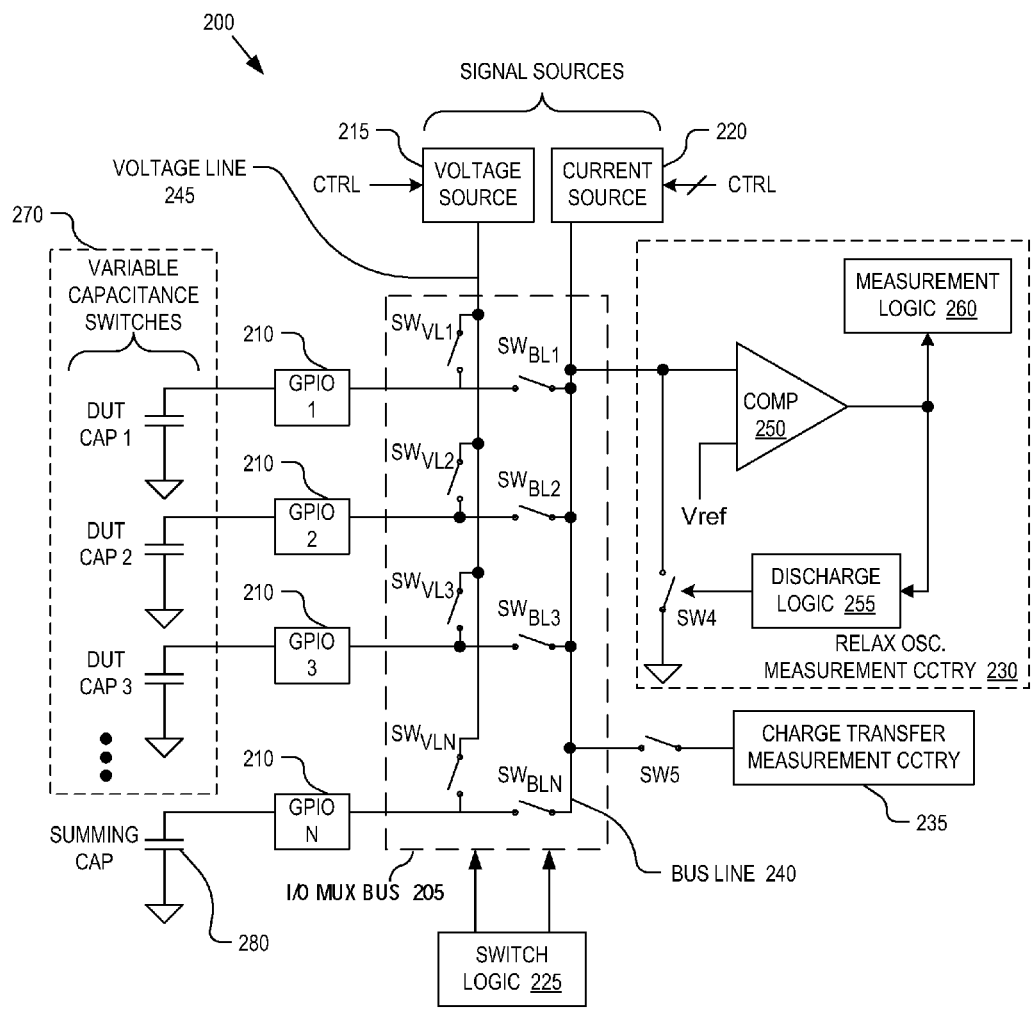
FIG. 2 is functional block diagram illustrating an input/output ("I/O") multiplexer bus and capacitance sensing circuitry coupled thereto, in accordance with an embodiment of the invention.

FIG. 2 is functional block diagram illustrating an input/output ("I/O") system 200, in accordance with an embodiment of the invention. The illustrated embodiment of I/O system 200 includes an I/O multiplexer ("MUX") bus 205, general purpose I/O ("GPIO") ports 210, a voltage source 215, a current source 220, switch logic 225, relaxation oscillator circuitry 230, and charge transfer measurement circuitry 235.

Relaxation oscillator circuitry 230 and charge transfer measurement circuitry 235 represent two examples of capacitance measuring circuits that may be coupled to I/O MUX bus 205. The capacitance measuring circuits can be time multiplexed or time shared by I/O MUX bus 205 to selectively measure/monitor the capacitance of external device under test ("DUT") capacitors (e.g., DUT CAP 1, DUT CAP 2, DUT CAP 3) coupled via GPIOs 210. Although the illustrated embodiment of I/O system 200 includes only relaxation oscillator measurement circuitry 230 and charge transfer measurement circuitry 235, it should be appreciated that any number and other types of circuitry may be coupled internally to I/O multiplexer bus 205 for time multiplexing across GPIO ports 210. For example, other types of capacitance measuring/monitoring circuitry may be coupled internally to I/O MUX bus 205, such as a successive approximate capacitance measuring circuit, or otherwise. Other non-capacitance sense related circuitry may also be multiplexed onto GPIO ports 210 via I/O MUX bus 205. In one embodiment, GPIO ports 210 are analog I/O ports of a semiconductor device. GPIO ports 210 may include electrostatic discharge ("ESD") protection circuitry for protecting the internal structure of the semiconductor device (e.g., relaxation oscillator measurement circuitry 230 or charge transfer measurement circuitry, etc.).

The illustrated embodiment of I/O MUX bus 205 includes a bus line 240, a voltage line 245, bus line switches (e.g., SW_BL1, SW_BL2, SW_BL3 . . . SW_BLN) and voltage line switches (e.g., SW_VL1, SW_VL2, SW_VL3 . . . SW_VLN). Current source 220 is coupled to bus line 240 while voltage source 215 is coupled to voltage line 245. In one embodiment, one or both of current source 220 and voltage source 215 are variable sources capable of driving selectable currents or voltages onto bus line 240 or voltage line 245, respectively. For example, current source 220 may be a processor controlled current digital-to-analog converter ("DAC"). Similarly, voltage source 215 may be a processor controlled voltage DAC, or other selectable voltage divider circuit. Collectively, voltage source 215 and current source 220 may be referred to as "signal sources" herein.

In one embodiment, bus line 240 is capable of propagating analog or digital signals in or out of GPIO ports 210. Similarly, voltage line 245 may be capable of propagating analog or digital signals through GPIO ports 210. The bus line switches and voltage line switches are programmable and controlled by switch logic 225. In one embodiment, each bus line switch and voltage line switch can be independently controlled and switched by switch logic 225. Accordingly, the bus line switches can be configured to divert current form current source 220 through any one or more of GPIO ports 210 and the voltage line switches can be configured to couple any of GPIO ports 210 to voltage source 215.

The illustrated embodiment of relaxation oscillator measurement circuitry 230 includes a comparator 250, discharge logic 255, a discharge switch SW4, and measurement logic 260. Relaxation oscillator measurement circuitry 230 may be used to implement various types of relaxation oscillator capacitance sensing techniques. During operation, switching logic 225 configures the bus line switches to divert current from current source 220 into one of GPIO ports 210. When the externally coupled DUT capacitor charges to a voltage Vref, the output of comparator 250 toggles, causing discharge logic 255 to close discharge switch SW4. The closed discharge switch SW4 discharges bus line 240 and the externally coupled DUT capacitor. The externally attached DUT capacitor may be reciprocally charged and discharged by current source 220 and discharge switch SW4 for a fixed number of cycles or a period of time. During this charge and discharging phase, measurement logic 260 can analyze the output of comparator 250 to measure or monitor for capacitance changes in the selected DUT capacitor. Measurement logic 260 may use a variety of techniques to monitor for capacitance changes by directly or indirectly monitoring for period changes, frequency changes, or duty cycle of the output of comparator 250. In one embodiment, the output from comparator 250 is used to gate a clock signal to form a counter. The number of gated clock cycles counted by the counter is then related to the capacitance on the selected DUT capacitor. Once relaxation oscillator measurement circuitry 230 has measured the capacitance of a selected externally coupled DUT capacitor, then switching logic 225 can reprogram I/O MUX bus 205 to sequentially coupled each DUT capacitor to relaxation oscillator measurement circuitry 230, in turn, for capacitance measuring. Switch logic 225 may follow a fixed sequence that is repeated to time share the capacitance measurement circuitry across all or a portion of GPIO ports 210, or follow a random sequence. The operation of relaxation oscillator measurement circuitry 230 is described in detail below in connection with FIG. 4.

The illustrated embodiment of I/O system 200 further includes charge transfer measurement circuitry 235 for measuring and monitoring the capacitance of the externally coupled DUT capacitors. Charge transfer measurement circuitry 235 may be selectively coupled to bus line 240 via switch SW5 under control of switch logic 225 to measure the capacitance of any one of the externally coupled DUT capacitors. In one embodiment, charge transfer measurement circuitry 235 may include an analog-to-digital converter ("ADC") for measuring an accumulated voltage on a summing capacitor 280 coupled to GPIO port (N) and outputting a digital value indicative of the analog voltage value. Operation of charge transfer measurement circuitry 235 is described in detail below in connection with FIG. 5. Although relaxation oscillator measurement circuitry 230 and charge transfer measurement circuitry 235 are illustrated as distinct circuits, in some embodiments they may share internal components.

It should be appreciated that I/O MUX bus 205 may be used to implement a flexible I/O subsystem for multiplexing a plurality of miscellaneous internal circuits across a plurality of I/O ports. However, I/O MUX bus 205 is well suited for coupling a capacitance sense user interface to an integrated circuit control system. In this operating scenario, the DUT capacitors may represent variable capacitance switches of a capacitance sense interface 270. The capacitance sense interface 270 may be a simple multi-button interface where each variable capacitance switch corresponds to an individual capacitance sense button, a linear or radial slider where each variable capacitance switch represents an individual resolution element of the linear or radial slider.

Figure 3:
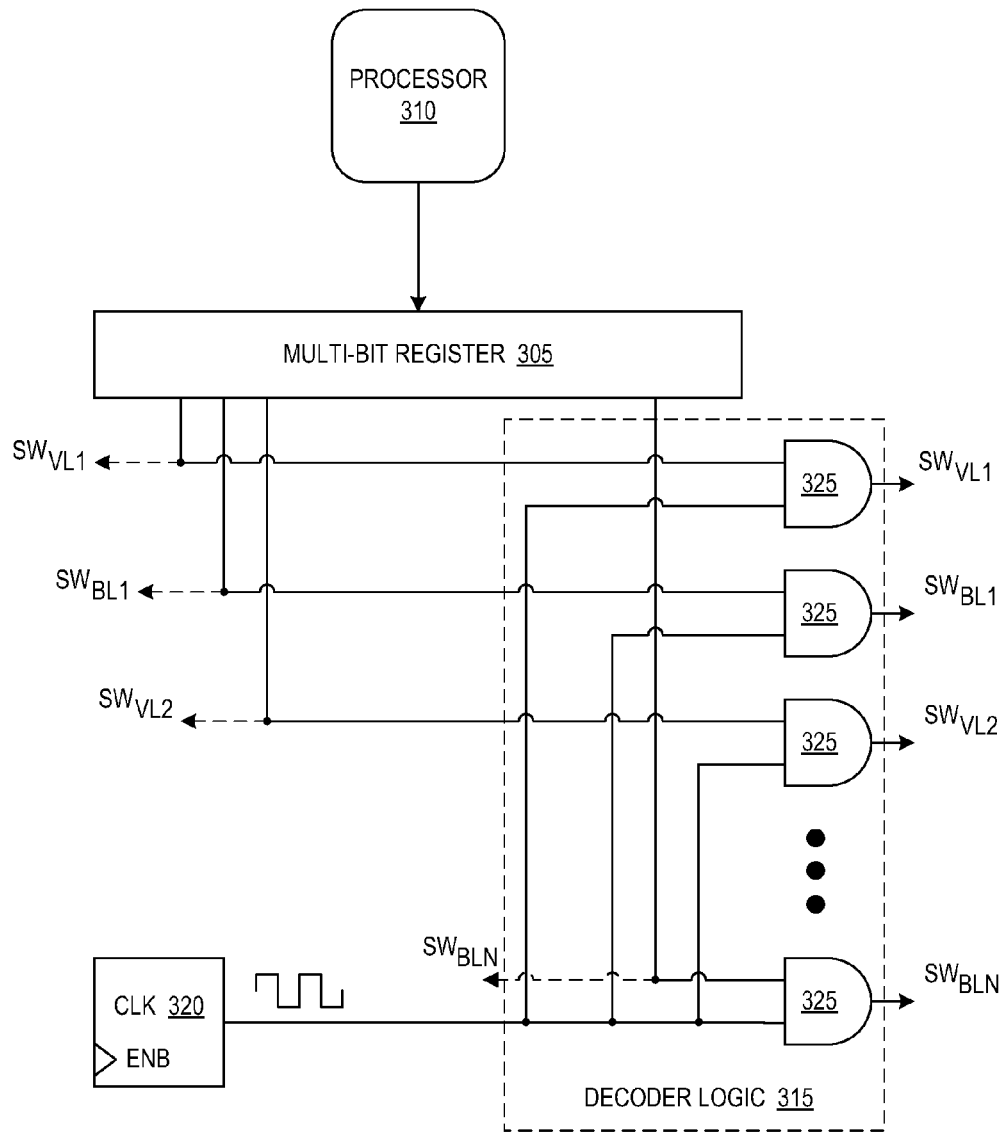
FIG. 3 is a functional block diagram illustrating switch logic for controlling switches within an I/O multiplexer bus, in accordance with an embodiment of the invention.

FIG. 3 is a functional block diagram illustrating switch logic 300 for controlling switches within I/O MUX bus 205, in accordance with an embodiment of the invention. Switch logic 300 represents one possible embodiment of switch logic 225 in FIG. 2. The illustrated embodiment of switch logic 300 includes a multi-bit register 305, a processor 310, decoder logic 315, and a clock source 320. The illustrated embodiment of decoder logic 315 includes logic gates 325.

During operation, processor 310 programs multi-bit register 305 with a multi-bit value, which is then decoded to control the bus line switches, the voltage line switches, and switch SW5. In one embodiment, each switch controlled by switch logic 300 corresponds to a single bit location within multi-bit register 305. Control terminals of the switches may be directly coupled to individual bit positions within multi-bit register 305 (illustrated by the dash arrows), or may be indirectly coupled via decoder logic 315.

In an embodiment where the control terminals of the switches are directly coupled, if the bit position corresponding to a particular switch is programmed to '0', the switch is closed, if the bit position is programmed to '1', the switch is opened (or visa versa). Decoder logic 315 may be interposed between the control terminals of the switches and multi-bit register 305 to provide automated frequency switching of selected switches. For example, during operation it may be desirable to scan through each GPIO port 210 and reciprocally charge and discharge each variable capacitance switch for a period of time or set number cycles, before moving to the next GPIO port 210 in a scan sequence. Clock source 320 may be used to set the reciprocal charge and discharge frequency while multi-bit register 305 can be programmed under control of processor 310 to determine the scan sequence.

Figure 4:
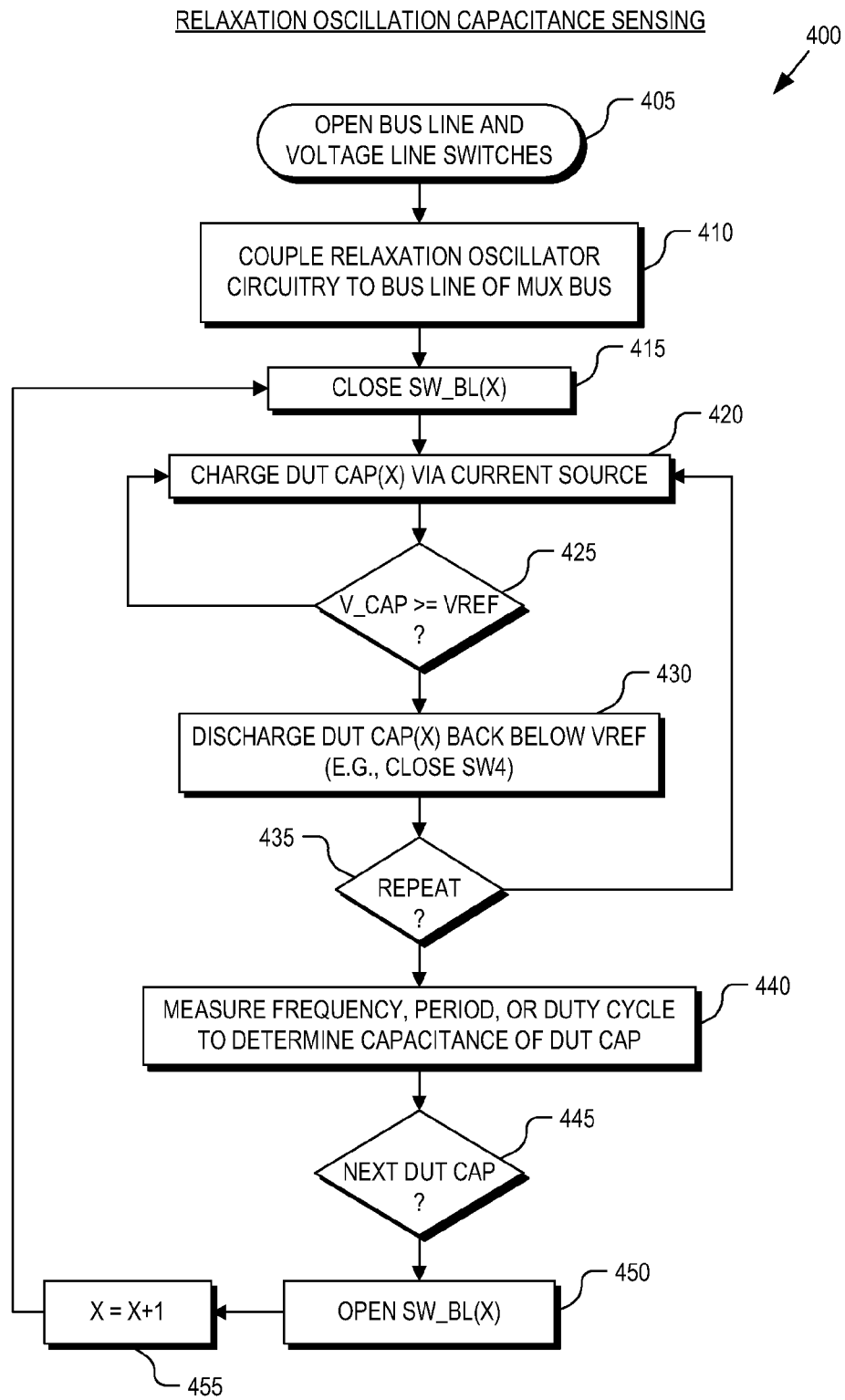
FIG. 4 is a flow chart illustrating a process for operating an I/O multiplexer bus to implement a relaxation oscillator capacitance sensing technique, in accordance with an embodiment of the invention.

FIG. 4 is a flow chart illustrating a process 400 for operating I/O MUX bus 205 to implement a relaxation oscillator capacitance sensing technique, in accordance with an embodiment of the invention. Process 400 may be implemented to monitor the variable capacitance switches of capacitance sense interface 270 using relaxation oscillator measurement circuitry 230. The order in which some or all of the process blocks appear in process 400 below should not be deemed limiting. Rather, one of ordinary skill in the art having the benefit of the present disclosure will understand that some of the process blocks may be executed in a variety of orders or even in parallel.

In a process block 405, the bus line and voltage line switches are open circuited under control of switch logic 225. In a process block 410, relaxation oscillator measurement circuitry 230 is coupled to bus line 240. In one embodiment, coupling relaxation oscillator measurement circuitry 230 may include closing a switch coupled between relaxation oscillator measurement circuitry 230 (not illustrated) or simply enabling comparator 250.

Once relaxation oscillator measurement circuitry 230 is coupled and enabled, a selected one of the bus line switches (e.g., SW_BL(X), wherein X=1) is closed (process block 415) to couple DUT CAP(X) to bus line 240. Once closed, current source 220 commences charging DUT CAP(X) through SW_BL(X) (process block 420) until the voltage V_CAP on DUT CAP(X) reaches Vref (decision block 425). Once V_CAP reaches Vref, the output of comparator 250 toggles causing discharged logic 255 to close circuit switch SW4, thereby discharging bus line 240 and DUT CAP(X) through switch SW4 back below Vref (process block 430). Once the voltage on DUT CAP(X) falls below Vref, comparator 250 toggles its output once again and discharge logic 255 open circuits switch SW4. In one embodiment, discharge logic 255 may include a latch or other time delay circuit to introduce a small feedback delay for controlling discharged switch SW4. Process 400 loops back to process block 420 reciprocally charging (process block 420) and discharging (process block 430) DUT CAP(X) until a fixed number of cycles has been reached or a period of time has expired (decision block 435).

In a process block 440, measurement logic 260 determines the capacitance or capacitance change of DUT CAP (X) based on the output of comparator 250. Measurement logic 260 may monitor for frequency changes, period changes, or changes in the duty cycle of the output from comparator 250 to determine whether the capacitance of DUT CAP(X) has significantly changed, thereby indicating a user instigated button press or other user interaction with capacitance sense interface 270.

In a decision block 445, switch logic 225 determines that it is time to reconfigure I/O MUX bus 205 to couple relaxation oscillator circuitry 230 to the next GPIO port 210 in the sequence. This determination may be based upon a number of toggle cycles of comparator 250, a number of clock cycles of a system clock, upon expiration of a fixed period of time, randomly, or otherwise. Finally, SW_BL(X) is open circuited (process block 450), the next GPIO port 210 in the sequence determined (process block 455) and process 400 repeats itself from process block 415. Process block 455 illustrates a simply incremental sequence whether GPIO ports 210 are scanned in an incrementing order; however, it should be appreciated that more complex sequences may be implemented by switch logic 225, including random sequences using a pseudo-random sequence generator.

Figure 5:
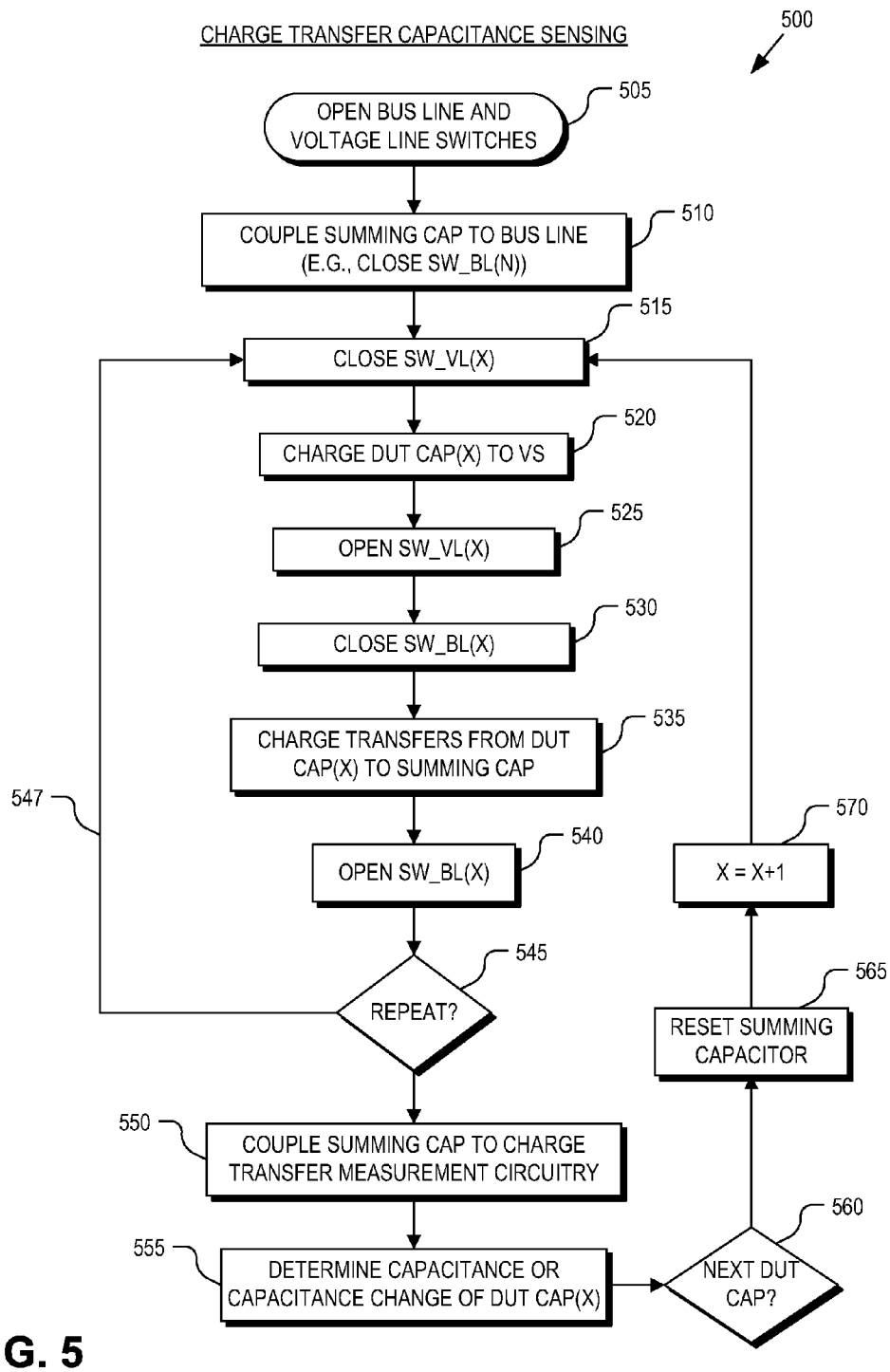
FIG. 5 is a flow chart illustrating a process for operating an I/O multiplexer bus to implement a charge transfer capacitance sensing technique, in accordance with an embodiment of the invention.

FIG. 5 is a flow chart illustrating a process 500 for operating I/O MUX bus 205 to implement a charge transfer capacitance sensing technique, in accordance with an embodiment of the invention. Process 500 may be implemented to monitor the variable capacitance switches of capacitance sense interface 270 using charge transfer measurement circuitry 235. The order in which some or all of the process blocks appear in process 500 below should not be deemed limiting. Rather, one of ordinary skill in the art having the benefit of the present disclosure will understand that some of the process blocks may be executed in a variety of orders or even in parallel.

In a process block 505, the bus line and voltage line switches are open circuited under control of switch logic 225. In a process block 510, summing capacitor 280 is coupled to bus line 240 by closing the associated bus line switch SW_BLN. In one embodiment, summing capacitor 280 is an externally coupled capacitor having a capacitance significantly larger than any of the DUT capacitors of capacitance sense interface 270.

In a process block 515, SW_VL(X) (e.g., X=1 for the first scan through capacitance sense interface 270) is closed under control of switch logic 225, coupling DUT CAP(X) to voltage source 215 and charging DUT CAP(X) to a supply voltage VS (process block 520). In a process block 525, SW_VL(X) is open circuited to decoupled voltage source 215 from DUT CAP(X). Once voltage line 245 has been decoupled from GPIO port (X) 210, then SW_BL(X) is closed circuited (process block 530) to transfer the charge accumulated on DUT CAP(X) onto summing capacitor 280 via bus line 240 (process block 535). Once the charge is transferred, SW_BL(X) is once again open circuited (process block 540), and process 500 loops back to process block 515 to execute another set of charge and charge transfer cycles (note, the charge transfer phase may also be referred to as a discharge phase). In one embodiment, the switch logic 225 continues to loop back along path 547 for a fixed number of cycles (decision block 545), reciprocally charging DUT CAP(X) via voltage source 215 and discharging DUT CAP(X) into summing capacitor 280.

After the charging and discharging cycles are complete, summing capacitor 280 is coupled to charge transfer measurement circuitry 235 via closing SW5 (process block 550). In process block 555, charge transfer measurement circuitry 235 analyzes the accumulated charge or voltage on summing capacitor 280 to determine the capacitance or capacitance change of DUT CAP(X). In one embodiment, charge transfer measurement circuitry 235 includes an ADC that measures the final voltage on summing capacitor 280.

Once the capacitance or capacitance change on DUT CAP(X) is determined, switch logic 225 reconfigures I/O MUX bus 205 to test/analyze the next variable capacitance switch within capacitance sense interface 270 (decision block 560). Prior to analyzing the next DUT capacitor, summing capacitor 280 is reset (e.g., discharged) (process block 565). In a process block 570, the next DUT capacitor in the scan sequence is determined. In the illustrated embodiment, the scan sequence is a simply scans through GPIO ports 210 in order; however, any scan sequence can be implemented including a random or irregular sequence.

Figure 6:
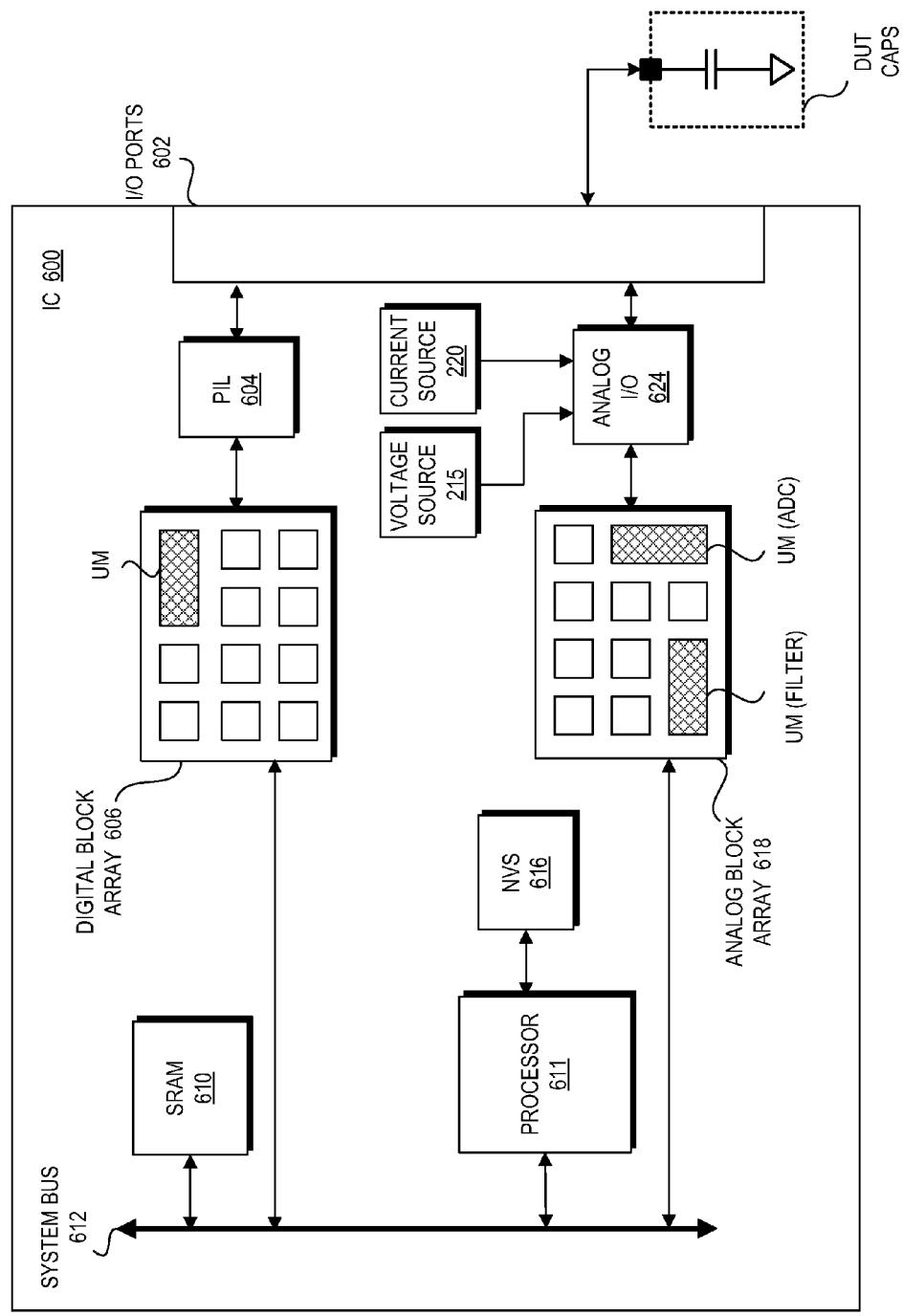
FIG. 6 illustrates a demonstrative integrated circuit for implementing an embodiment of the invention.

FIG. 6 illustrates a demonstrative integrated circuit ("IC") 600 implemented using an embodiment of I/O system 200. IC 600 illustrates a Programmable System on a Chip (PSoC™) microcontroller by Cypress Semiconductor Corporation. The illustrated embodiment of IC 600 includes programmable input/output ("I/O") ports 602, at least a portion of which correspond to GPIO ports 210. I/O ports 602 are coupled to Programmable Interconnect and Logic ("PIL") 604 which acts as an interconnect between I/O ports 602 and a digital block array 606. Digital block array 606 may be configured to implement a variety of digital logic circuits (e.g., DAC, digital filters, digital control systems, etc.) using configurable user modules ("UMs"). Digital block array 606 is further coupled to a system bus 612.

Static Random Access Memory ("SRAM") 610 and processor 611 are also coupled to system bus 612. Processor 611 is coupled to non-volatile storage ("NVS") 616 which may be used to store firmware (e.g., control algorithms executable by processor 611 to implement process 400 or 500). In one embodiment, processor 611 corresponds to processor 310 and implements a portion of switch logic 300 to program multi-bit register 305

An analog block array 618 is coupled to system bus 612. Analog block array 618 also may be configured to implement a variety of analog circuits (e.g., ADC, analog filters, comparators, current sources, etc.) using configurable UMs. Analog block array 618 is also coupled to an analog I/O unit 624 which is coupled to I/O ports 602. In one embodiment, I/O MUX bus 205 is included within analog I/O 624.

As illustrated, voltage source 215 and current source 220 may be incorporated into IC 600 and coupled to analog I/O unit 624. Various subcomponents of relaxation oscillator measurement circuitry 230 and charge transfer measurement circuitry 235 may be implemented with various UMs of digital clock array 606 and/or analog block array 618 or the subcomponents may be stand alone components.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

I/O system 200 may be incorporated into IC 600, as well as, various other integrated circuits. Descriptions of I/O system 200 may be generated and compiled for incorporation into other integrated circuits. For example, behavioral level code describing I/O system 200, or portions thereof, may be generated using a hardware descriptive language, such as VHDL or Verilog, and stored to a machine-readable storage medium. Furthermore, the behavioral level code can be compiled into register transfer level ("RTL") code, a netlist, or even a circuit layout and stored to a machine-readable storage medium. The behavioral level code, the RTL code, the netlist, and the circuit layout all represent various levels of abstraction to describe I/O system 200.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A device comprising:
   switch logic configured to control a plurality of switches included in an I/O bus to couple at least one of one or more of a plurality of single line I/O ports to measurement circuitry and to one or more signal sources; and
   measurement circuitry configured to programmatically measure a capacitance of one or more externally connected electrical elements of a capacitive sense interface coupled to the plurality of single line I/O ports based on a configuration of the plurality of switches.

2. The device of claim 1, wherein the one or more externally connected electrical elements comprises at least one of a capacitance sense button and a slider, wherein each externally connected electrical element represents an individual resolution element of the slider.

3. The device of claim 1, wherein the switch logic is further configured to scan the capacitive sense interface by iteratively coupling the measurement circuitry and the one or more signal sources to the one or more externally connected electrical elements to acquire a plurality of measurements to determine an activation of at least one of the externally connected electrical elements of the capacitive sense interface.

4. The device of claim 3, wherein the measurement circuitry comprises a relaxation oscillator circuit configured to process the plurality of measurements of the scan based on an electrical input from the at least one of the externally connected electrical elements.

5. The device of claim 4, wherein the relaxation oscillator circuit is configured to determine a change in capacitance of the at least one of the externally connected electrical elements based the plurality of measurements.

6. The device of claim 5, wherein the plurality of measurements includes measuring at least one of frequency changes, period changes, and changes in duty cycle of a signal associated with the electrical input from the at least one of the externally connected electrical elements.

7. The device of claim 3, wherein the measurement circuitry comprises a charge transfer measurement circuit coupled to a summing capacitor.

8. The device of claim 7, wherein the charge transfer measurement circuit is configured to process the plurality of measurements of the scan based on a voltage received from the summing capacitor, wherein the summing capacitor is configured to receive an electrical input comprising charge from the at least one of the externally connected electrical elements.

9. The device of claim 1, wherein the one or more signal sources includes a voltage source and a current source.

10. A system comprising:
a plurality of single line input/output (I/O) ports, each I/O port coupled to and between a capacitive sense interface and an I/O bus;
switch logic configured to control a plurality of switches included in the I/O bus to couple at least one of one or more of the plurality of single line I/O ports to measurement circuitry and to one or more signal sources; and
measurement circuitry configured to programmatically measure a capacitance of one or more externally connected electrical elements of a capacitive sense interface coupled to the plurality of single line I/O ports based on a configuration of the plurality of switches.

11. The system of claim 10, wherein the switch logic is further configured to scan the capacitive sense interface by iteratively coupling the measurement circuitry and the one or more signal sources to the one or more externally connected electrical elements to acquire a plurality of measurements to determine an activation of at least one of the externally connected electrical elements of the capacitive sense interface.

12. The system of claim 11, wherein the measurement circuitry comprises a relaxation oscillator circuit configured to process the plurality of measurements of the scan based on an electrical input from the at least one of the externally connected electrical elements.

13. The system of claim 12, wherein the relaxation oscillator circuit is configured to determine a change in capacitance of the at least one of the externally connected electrical elements based the plurality of measurements.

14. The system of claim 13, wherein the plurality of measurements includes measuring at least one of frequency changes, period changes, and changes in duty cycle of a signal associated with the electrical input from the at least one of the externally connected electrical elements.

15. The system of claim 11, wherein the measurement circuitry comprises a charge transfer measurement circuit coupled to a summing capacitor, and wherein the charge transfer measurement circuit is configured to process the plurality of measurements of the scan based on a voltage received from the summing capacitor, wherein the summing capacitor is configured to receive an electrical input comprising charge from the at least one of the externally connected electrical elements.

16. A method comprising:
configuring a plurality of switches of an input/output (I/O) bus, the configuring including coupling at least one of one or more of a plurality of single line I/O ports to measurement circuitry and to one or more signal sources; and
measuring a capacitance associated with one or more externally connected electrical elements of a capacitive sense interface coupled to the plurality of single line I/O ports based on the configuring of the plurality of switches.

17. The method of claim 16, wherein the one or more externally connected electrical elements comprises at least one of a capacitance sense button and a slider, wherein each externally connected electrical element represents an individual resolution element of the slider.

18. The method of claim 17, wherein the configuring of the plurality of switches of the I/O bus further comprises:
scanning the capacitive sense interface by iteratively coupling the measurement circuitry and the one or more signal sources to the one or more externally connected electrical elements; and
acquiring a plurality of measurements to determine an activation of at least one of the externally connected electrical elements of the capacitive sense interface.

19. The method of claim 18, wherein the acquiring of the plurality of measurements further comprises measuring at least one of frequency changes, period changes, and changes in duty cycle of a signal associated with an electrical input from the at least one of the externally connected electrical elements.

20. The method of claim 18, wherein the acquiring of the plurality of measurements further comprises:
receiving, at a summing capacitor, an electrical input comprising charge from the at least one of the externally connected electrical elements; and
processing an accumulated charge associated with the summing capacitor.

* * * * *